(12) United States Patent
Watanabe et al.

(10) Patent No.: US 8,343,865 B2
(45) Date of Patent: Jan. 1, 2013

(54) SEMICONDUCTOR DEVICE HAVING DUAL WORK FUNCTION METAL

(75) Inventors: Koji Watanabe, Kawasaki (JP); Shin Koyama, Kawasaki (JP)

(73) Assignee: Renesas Electronics Corporation, Kawasaki-shi, Kanagawa (JP)

( * ) Notice: Subject to any disclaimer, the term of this patent is extended or adjusted under 35 U.S.C. 154(b) by 0 days.

(21) Appl. No.: 12/929,350

(22) Filed: Jan. 18, 2011

(65) Prior Publication Data

US 2011/0175167 A1    Jul. 21, 2011

Related U.S. Application Data

(60) Provisional application No. 61/297,141, filed on Jan. 21, 2010.

(51) Int. Cl.
*H01L 21/28* (2006.01)

(52) U.S. Cl. ................. 438/591; 257/E21.158

(58) Field of Classification Search .......... 438/591; 257/E21.158
See application file for complete search history.

(56) References Cited

U.S. PATENT DOCUMENTS

| | | | |
|---|---|---|---|
| 6,770,521 B2 * | 8/2004 | Visokay et al. | |
| 7,504,700 B2 * | 3/2009 | Zhu et al. | |
| 8,004,044 B2 * | 8/2011 | Ogawa et al. | |
| 2005/0233526 A1 * | 10/2005 | Watanabe et al. | |
| 2006/0237803 A1 * | 10/2006 | Zhu et al. | |
| 2009/0045469 A1 * | 2/2009 | Takahashi | |
| 2009/0218634 A1 * | 9/2009 | Sakashita et al. | |
| 2009/0309165 A1 * | 12/2009 | Ogawa et al. | |
| 2009/0321844 A1 * | 12/2009 | Ichihara et al. | |
| 2010/0038729 A1 * | 2/2010 | Eimori et al. | |
| 2010/0102395 A1 * | 4/2010 | Yamamoto et al. | |
| 2011/0127616 A1 * | 6/2011 | Hoentschel et al. | 257/392 |
| 2011/0254062 A1 * | 10/2011 | Shimizu et al. | |

OTHER PUBLICATIONS

C. S. Park, M. M. Hussain, J. Huang, C. Park, K. Tatciwa, C. Young, H. K. Park, M. Cruz, D. Gilmer, K. Rader, J. Price, P. Lysaght, D. Heh, G. Bersuker, P. D. Kirsch, H..H. Tseng and R. Jammy, 2009 Symposium on VLSI Technology, 11A-1, p. 208, (2009).*
Y. Kamimuta, K. Iwamoto, Y. Nunoshige, A. Hirano, W. Mizubayashi, Y. Watanabe, S. Migita, A. Ogawa, H. Ota, T. Nabatame, and A. Toriumi, Tech. Dig. IEDM 2007, p. 341 (2007).*

* cited by examiner

*Primary Examiner* — Alexander Ghyka
*Assistant Examiner* — Stanetta Isaac
(74) *Attorney, Agent, or Firm* — McGinn IP Law Group, PLLC

(57) ABSTRACT

A method of forming a semiconductor device includes forming a dummy metal gate layer including work function metals directly on a base insulator, diffusing the work function metals into the base insulator by annealing, removing the dummy metal gate layer by a wet etching, forming a metal gate on the base insulator, and forming a high-k insulator on the metal gate.

5 Claims, 7 Drawing Sheets

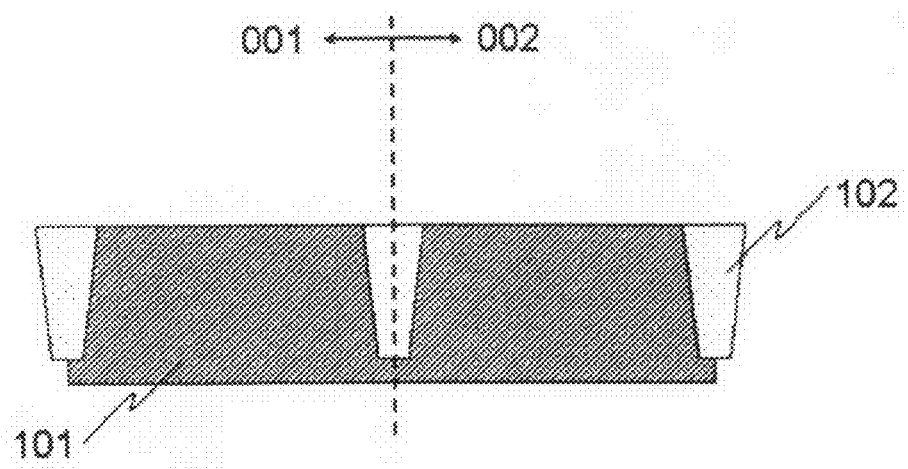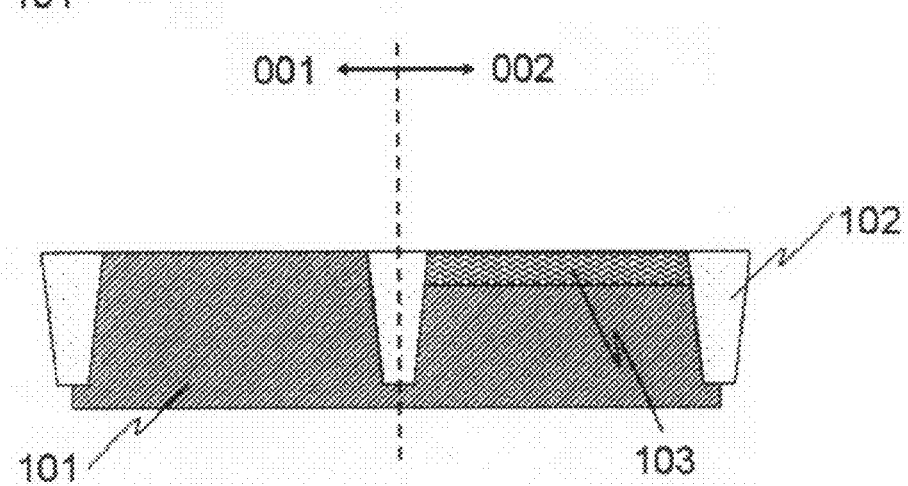

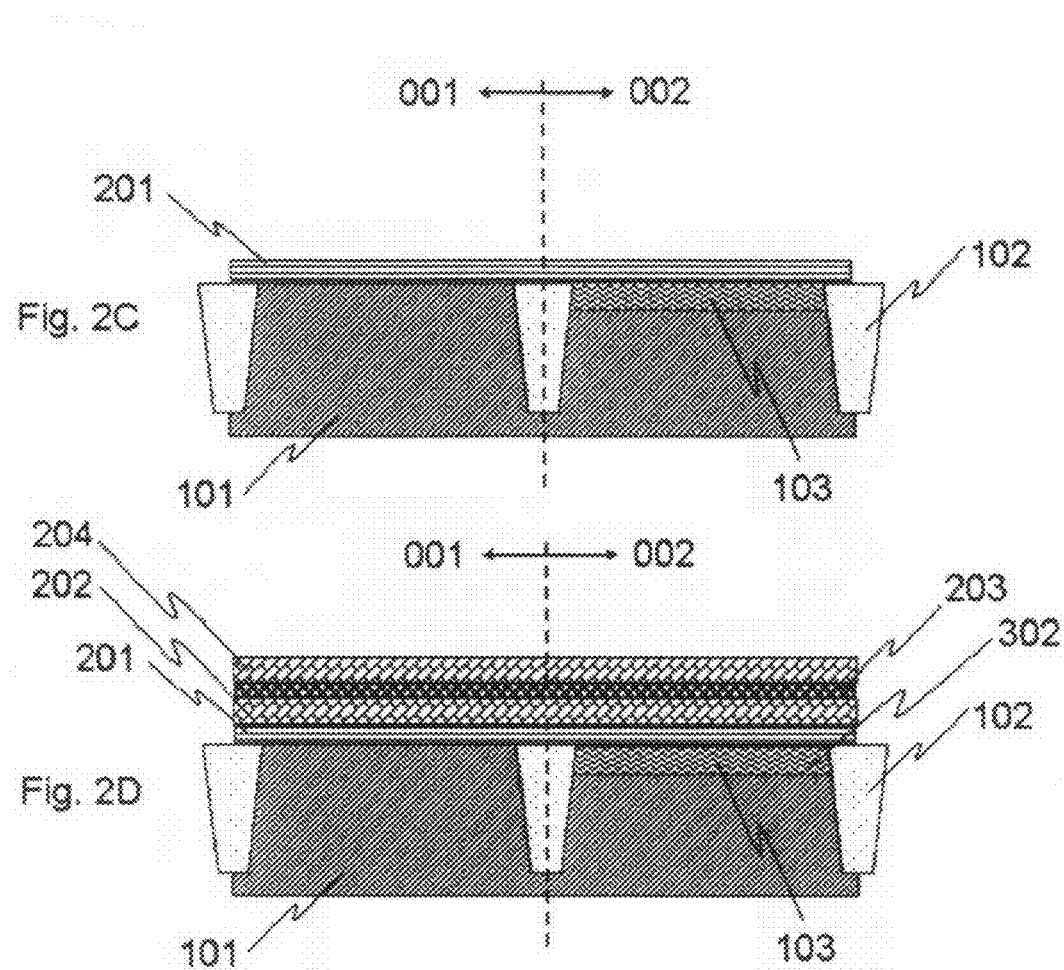

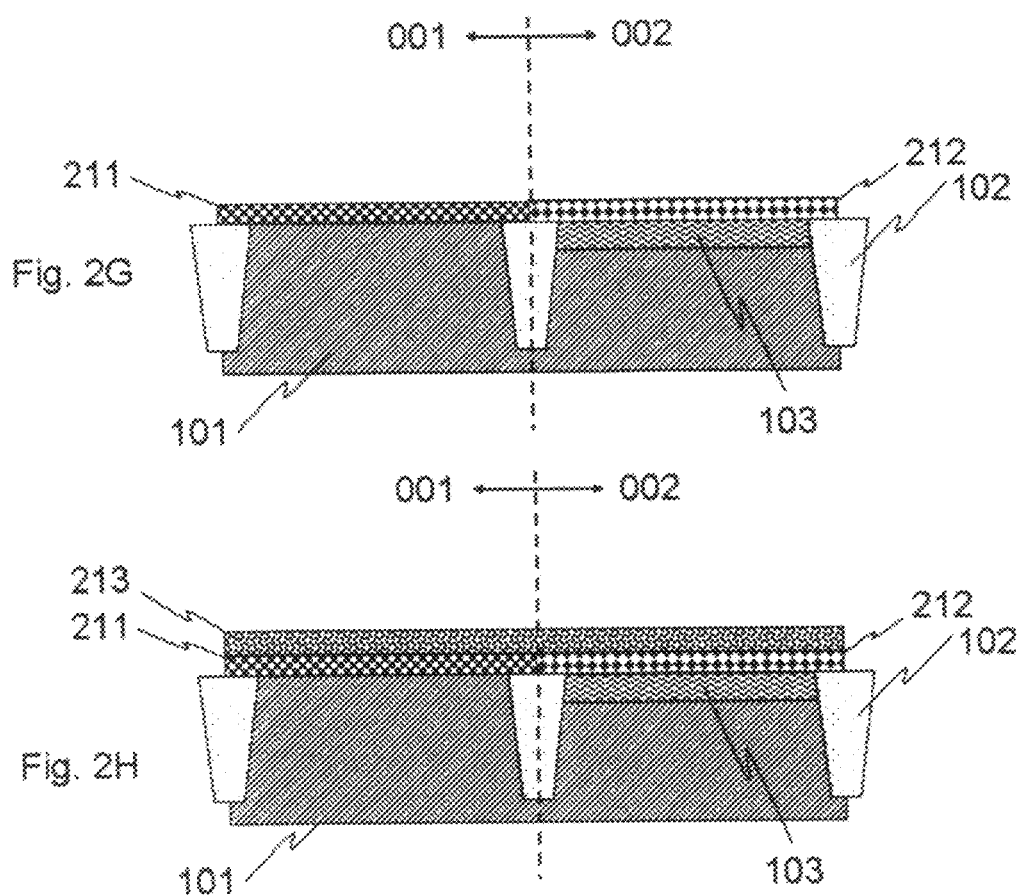

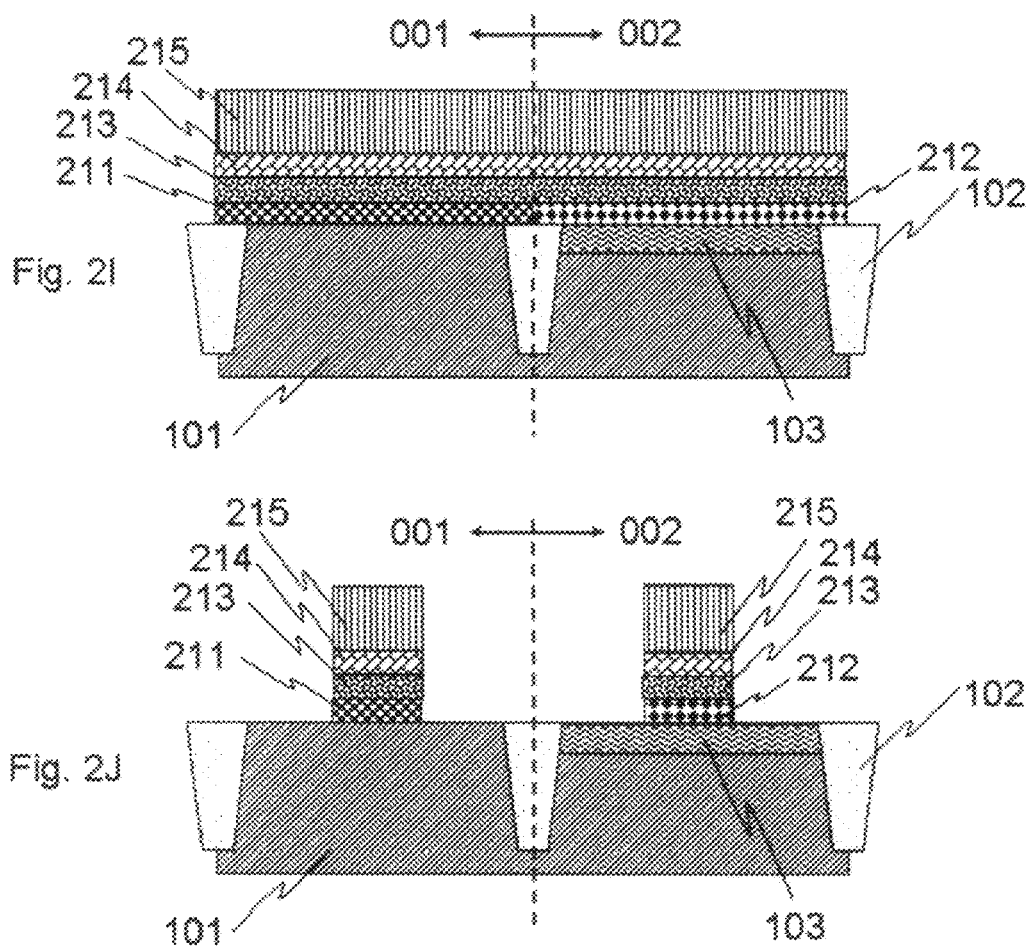

SEMICONDUCTOR DEVICE HAVING DUAL WORK FUNCTION METAL

The present Application is a Nonprovisional Application of Provisional U.S. Patent Application No. 61/297,141, filed on Jan. 21, 2010, incorporated herein by reference.

BACKGROUND OF THE INVENTION

1. Field of the Invention

The present invention relates to a semiconductor device, in particular, to a semiconductor device including dual work function metal at the interface between high-k and base insulator.

2. Description of Related Art

Recently, a semiconductor device including a metal gate and high-k is becoming popular because the device can achieve a low current leakage. In order to obtain metal gate transistors having different threshold voltage, changing the work function of the gate for the transistors should be needed.

The following documents describe such technologies.

1) C. S. Park, M. M. Hussain, J. Huang, C. Park, K. Tateiwa, C. Young, H. K. Park, M. Cruz, D. Gilmer, K. Rader, J. Price, P. Lysaght, D. Heh, G. Bersuker, P. D. Kirsch, H.-H. Tseng, and R. Jammy, 2009 Symposium on VLSI Technology, 11A-1, p 208, (2009).

As shown in FIG. 2 in C. S. Park, after an AlOx cap and a hard mask are formed on a high-k, the hard mask and the AlOx cap are selectively removed. Then, a LaOx cap is formed on the high-k gate insulator and the hard mask. That is, the AlOx cap and the LaOx cap for work function metal are provided on the high-k.

2) Hirofumi Shinohara, Akira Katakami, Toshinari Watanabe, Manabu Hayashi, Satoshi Kamiyama, Yoshihiro Sugita, Takeo Matsuki, Takahisa Eimori, Jiro Yugami, Kazuto Ikeda, and Yuzuru Ohji, 2009 International Conference on SSDM, B-5-2, pp 789-790, (2009).

As shown in FIG. 1 in Hirofumi, $Al_2O_3$ and $La_2O_3$ for work function metal are also provided on a high-k gate insulator ($HfO_2$).

SUMMARY

The inventors have realized the problems related to the related arts.

As the related art, work function metals for n/p FETs are deposited on the high-k gate insulator, and then those metals should be diffused to the high-k gate insulator by annealing. However, this method is very hard to control the threshold voltage (Vth) nearby the band edge for n/p FETs. The work function metal diffuses in the high-k gate insulator to the base insulator film. The work function metal makes a dipole at the interface between the high-k gate insulator and the base insulator. The amount of the dipole determines the Vth. Thus, the metal should be enough diffused to control the Vth nearby the band edge. Furthermore, it is required to precisely control the number of the metal at the interface for small variation of Vth. However, it is difficult to control the threshold voltage (Vth) nearby the band edge, because the amount of metal diffused in the high-k gate insulator depends on the thermal budget, the high-k thickness, and the high-k composition.

The inventors further have realized a third document as below.

3) Y. Kamimuta, K. Iwamoto, Y. Nunoshige, A. Hirano, W. Mizubayashi, Y. Watanabe, S. Migita, A. Ogawa, H. Ota, T. Nabatame, and A. Toriumi, Tech. Dig. IEDM 2007, p. 341 (2007).

FIG. 15 in Kamimuta proposes a structure including work function metals such as $Al_2O_3$ and $Y_2O_3$, which are arranged between a base layer ($SiO_2$) and a high-k gate insulator ($HfO_2$).

However, Hirofumi fails to disclose or teach a specific or suitable process to form a semiconductor device which includes dual function transistors at the same time. Moreover, since Hirofumi uses $HfO_2$ for the high-k gate insulator, when source/drain activation annealing is performed, the work function metal is diffused into the high-k gate insulator.

A method of forming a semiconductor device of an exemplary aspect includes forming a dummy metal gate layer including work function metals directly on a base insulator, diffusing the work function metals into the base insulator by annealing, removing the dummy metal gate layer by a wet etching, forming a metal gate on the base insulator, and forming a high-k gate insulator on the metal gate.

The exemplary aspect allows to easily controlling the Vth close to the band edge at n/p FETs and the small variation of Vth.

BRIEF DESCRIPTION OF THE DRAWINGS

The above and other exemplary aspects, advantages and features of the present invention will be more apparent from the following description of certain exemplary embodiments taken in conjunction with the accompanying drawings, in which:

FIGS. 2A-2L illustrate cross-sectional views showing an exemplary method of forming the semiconductor device in FIG. 1.

DETAILED DESCRIPTION OF THE EXEMPLARY EMBODIMENTS

Figure 1:
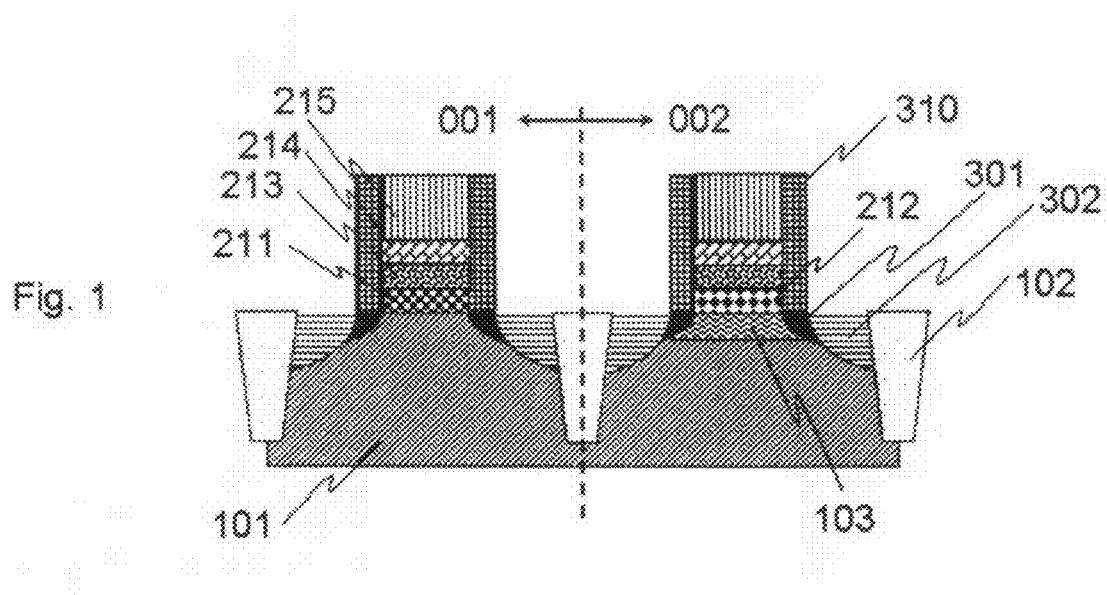
FIG. 1 illustrates a cross-sectional view showing a semiconductor device of an exemplary embodiment according to the present invention.

FIG. 1 shows a cross-sectional view showing a semiconductor device of an exemplary embodiment according to the present invention.

The semiconductor device includes an nFET region 001 and a pFET region 002 on a silicon substrate 101. Plural shallow trench isolations (STI) are formed on the silicon substrate 101 to separate the nFET region 001 and the pFET region 002. In the nFET region 001, an nFET transistor is provided. The nFET transistor includes an interfacial layer 211 as a base insulator, a high-k gate insulator 213, a metal gate electrode 214 and a poly-silicon layer 215, which are stacked in that order from the silicon substrate 101. On the contrary, in the pFET region 002, a pFET transistor is provided. The pFET transistor includes an interfacial layer 212, the high-k gate insulator 213, the metal gate electrode 214 and the poly-silicon layer 215, which are stacked in that order from the silicon substrate 101. The pFET transistor further includes a silicon-germanium (SiGe) channel 103 under the interfacial layer 212. Each of the nFET transistor and the pFET transistor includes side walls 310, extension regions 301 and source/drain regions 302.

The distribution of work function metals in the high-k gate insulator 213 has the peak at the interface between the high-k gate insulator 213 and the interfacial layer 211. The high-k gate insulator 213 has a distribution of work function metals diffused slightly at a side adjacent to the interface, as a final structure or product. The high-k gate insulator is a HfSiON layer, which is suitable to prevent the work function metals in the interfacial layers 211, 213 from diffusing into the high-k gate insulator.

FIGS. 2A-2L illustrate cross-sectional views each showing the respective steps for forming the semiconductor device in FIG. 1.

As shown in FIG. 2A, plural shallow trench isolations 102 are formed on the substrate 101 to provide the nFET region 001 and the pFET region 002. The substrate 101 in the nFET region 001 may be a p-well, and the substrate 101 in the pFET region 002 may be a n-well.

As shown in FIG. 2B, a silicon germanium (SiGe) channel 103 is formed by using an epitaxial growth process on the pFET region 002.

As shown in FIG. 2C, an interface layer 201 is formed on the nFET region 001 and the pFET region 002. The interface layer 201 may be a silicon oxide nitride (SiON) layer as the base insulator.

As shown in FIG. 2D, a first dummy metal gate layer 202, a first work function metal layer 203 for pFET, and a second dummy metal gate layer 204 are formed in that order on the nFET region 001 and the pFET region 002. The first dummy metal gate layer 202 may be a titanium nitride (TiN) layer. The first work function metal layer 203 may be an aluminum (Al) layer. The second dummy metal gate layer 204 may be a TiN layer. The formation of the first dummy metal gate layer 202, the first work function metal layer 203 and the second dummy metal gate layer can be called a first dummy metal gate deposition.

Figure 2E:
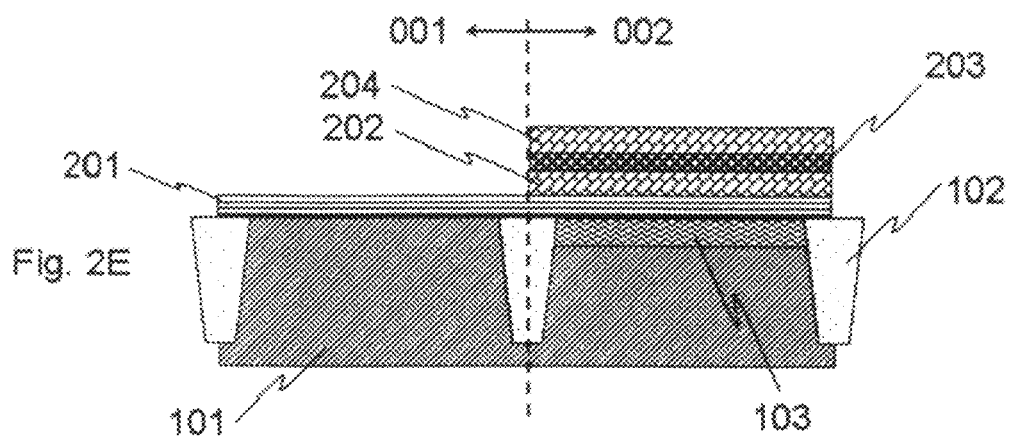

As shown in FIG. 2E, the first dummy metal gate layer 202, the first work function metal layer 203 and the second dummy metal gate layer 204 are selectively eliminated from the nFET region 001.

Figure 2F:
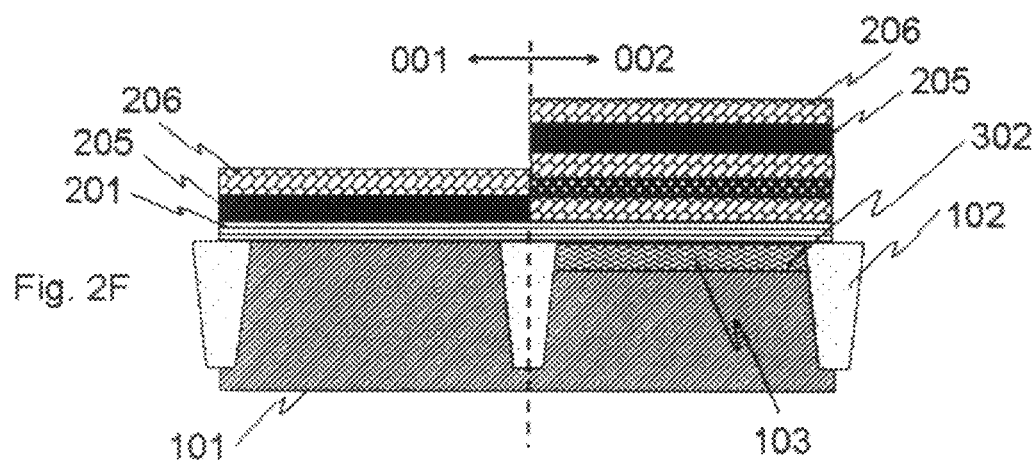

As shown in FIG. 2F, a second work function metal layer 205 and a third dummy metal gate layer 206 are formed in that order on the interface layer 201 in the nFET region 001, and on the second dummy metal gate layer 204 in the pFET region 002. The second work function metal layer 205 may be a lanthanum oxide (LaOx) layer. The third dummy metal gate layer 206 may be a TiN layer which functions as a hard mask. The formation of the second work function metal layer 205 and the third dummy metal gate layer can be called a second dummy metal gate deposition.

Then, a drive-in annealing process is performed to diffuse the material of the second work function metal layer 205 and the material of the first work function metal layer 203 into the interface layer 201, to form the interfacial layer 211 for the nFET and the interfacial layer 212 for the pFET, respectively. For example, in the nFET region 001, La included in the second work function metal layer 205 is diffused to the interface layer 201. On the other hand, in the pFET region 002, La included in the second work function metal layer 205 is diffused to the interface layer 201 via the first dummy metal gate 202 and the second dummy metal gate layer 204. Moreover, in the pFET region 002, Al included in the first work function metal layer 203 is diffused to the interface layer 201 and the second dummy metal gate layer 204. By the drive-in annealing, the interfacial layer 211 and the interfacial layer 212 can have different work functions so that the semiconductor device can have dual work function metals.

Then, a wet etching is performed to remove the third dummy metal gate layer 206, the second work function metal gate layer 205, the second dummy metal gate layer 204, the first work function metal layer 203 and the first dummy metal gate layer 202, to remain the interfacial layer 211 and the interfacial layer 212 on the substrate 101, as shown in FIG. 2G. Because the second work function metal layer 205 made of LaOx layer is formed on the second dummy metal gate layer made of TiN layer, the second work function metal layer 205 easily removed at the wet etching.

As shown in FIG. 2H, a high-k gate insulator 213 is deposited on the interfacial layer 211 and the interfacial layer 212. Because the high-k gate insulator 213 is provided after the drive-in annealing, the high-k gate insulator 213 does not substantially include any materials of the first work function metal layer 203 and the second work function metal layer 205 at this time. The high-k gate insulator 213 may be a hafnium silicon oxide nitride (HfSiON) layer.

As shown in FIG. 2I, a metal gate electrode 214 and a poly-silicon 215 is formed on the high-k gate insulator 213. The metal gate electrode 214 may be a TiN layer. The formation of the metal gate electrode 214 can be called a final metal gate deposition.

Then, a gate patterning is performed by selectively etching the poly-silicon 215, the metal gate electrode 214, the high-k gate insulator 213 and the interfacial layers 211, 212. As a result, a gate pattern for the nFET and a gate pattern for the pFET are formed on the nFET region 001 and the pFET region 002, respectively, as shown in FIG. 2J.

Figure 2K:
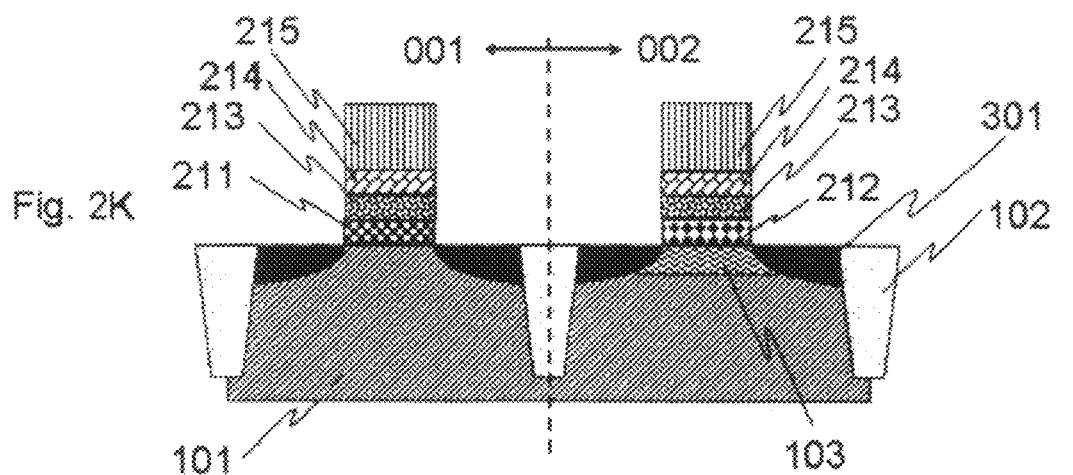

As shown in FIG. 2K, the extension regions 301 are provided, by using the gate patterns as a mask, on the substrate 101.

Figure 2L:
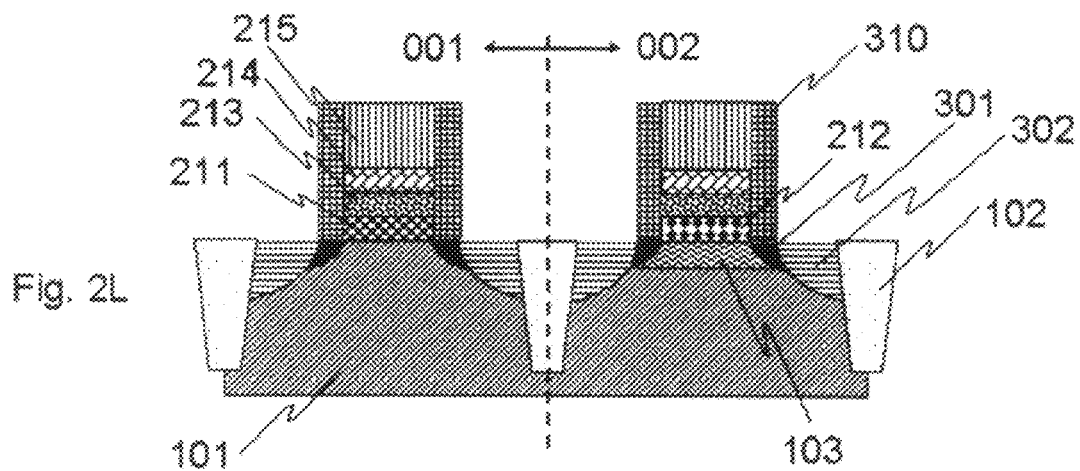

As shown in FIG. 2L, the side walls 310 are formed on the surfaces of the gate patterns. Then, source/drain regions 302 are formed by introducing impurities into the substrate 101, by using the gate patterns and the side walls 310 as a mask. In order to activate source/drain regions 302, annealing is performed. At that time, the HfSiON layer as the high-k gate insulator 213 can substantially or effectively prevent the work function materials in the interfacial layers 211, 212 from diffusing from the interfacial layers 211, 212 to the upper layers. The HfSiON layer is superior to HfO2 in this aspect. Therefore, the enough amount of the work function metal can be placed at the interface between the high-k gate insulator 213 and the interfacial layers 211, 212 as the base insulator. The distribution of work function metals in the high-k gate insulator 213 has the peak at the interface between the high-k gate insulator 213 and the interfacial layer 211. The high-k gate insulator 213 has a distribution of work function metals for n/p FETs diffused slightly at a side adjacent to the interface, as a final structure or product. However, it is noted that the slight distribution of work function metals in the high-k gate insulator 213 does not substantially make an impact to the setting of the threshold voltages of n/p FETs.

On the basis of the above method, the method can avoid to diffuse the work function metals of the first work function metal layer 203 and the second work function metal layer 205 into the high-k gate insulator 213 when the work function metals are diffused into the interface layer 201 to form the interfacial layers 211, 212. Thus, the method can control threshold voltages Vth of the pFET and nFET independently from the thermal budget, the high-k thickness, and the high-k composition.

It should be noted that the present invention is not limited only to the above described exemplary embodiments, and of course, various changes can be made within the scope not deviating from the gist of the present invention.

Further, it is noted that Applicant's intent is to encompass equivalents of all claim elements, even if amended later during prosecution.

What is claimed is:

1. A method of forming a semiconductor device, comprising:
   - forming an interface layer on a semiconductor substrate having a first region and a second region;
   - forming a first dummy metal gate layer on the interface layer, forming a first work function metal on the first dummy metal gate;
   - forming a second dummy metal gate layer on the first work function metal;
   - selectively removing the first dummy metal gate layer, the first work function metal and the second dummy metal gate layer on the first region of the semiconductor substrate, to leave the interface layer on the first region;
   - forming a second work function metal different from the first work function metal on the interface layer on the first region and the second dummy metal gate layer on the second region;
   - forming a third dummy metal gate layer on the second work function metal on the first and second regions;
   - annealing to diffuse the second work function metal into the interface layer on the first region and the first work function metal into the interface layer on the second region;
   - removing the second work function metal and the third dummy metal gate layer on the first region, and the first to third dummy metal gate layers and first and second work function metals on the second region, to leave the interface layer; and
   - forming a high-k insulator on the interface layer on the first and second regions.

2. The method as claimed in claim 1, wherein the high-k insulator comprises a HfSiON layer.

3. The method as claimed in claim 2, further comprising:
   performing source/drain annealing so that the work function metals are placed to have a peak of a distribution of the first and second work function metals at an interface between the high-k insulator and the interface layer.

4. The method as claimed in claim 3, wherein the high-k insulator has a distribution of the first and second work function metals diffused slightly at a side adjacent to the interface.

5. The method as claimed in claim 1, wherein the high-k insulator does not substantially contain the work function metal when the high-k insulator is formed.

* * * * *